(12) United States Patent
Tanaka et al.

(10) Patent No.: US 9,429,592 B2
(45) Date of Patent: Aug. 30, 2016

(54) CONNECTOR

(71) Applicant: FUJITSU COMPONENT LIMITED, Tokyo (JP)

(72) Inventors: Tetsugaku Tanaka, Tokyo (JP); Koki Sato, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 90 days.

(21) Appl. No.: 14/494,676

(22) Filed: Sep. 24, 2014

(65) Prior Publication Data

US 2015/0109014 A1 Apr. 23, 2015

(30) Foreign Application Priority Data

Oct. 17, 2013 (JP) ................. 2013-216727

(51) Int. Cl.
| | |
|---|---|
| *G01R 31/20* | (2006.01) |
| *G01R 1/067* | (2006.01) |
| *G01R 1/04* | (2006.01) |
| *H01R 13/24* | (2006.01) |
| *G01R 1/073* | (2006.01) |

(52) U.S. Cl.
CPC ......... *G01R 1/06733* (2013.01); *G01R 1/0466* (2013.01); *H01R 13/2428* (2013.01); *G01R 1/07314* (2013.01); *H01R 2201/20* (2013.01)

(58) Field of Classification Search
CPC .......... G01R 1/06722; G01R 31/2889; H01R 12/57; H01L 24/13; G01N 21/88
USPC .............. 324/754.11, 754.1, 754.07, 754.24, 324/755.01, 754.03, 756.03, 724, 437, 445, 324/446, 500; 439/482, 824, 342, 259–270
See application file for complete search history.

(56) References Cited

U.S. PATENT DOCUMENTS

| | | | |
|---|---|---|---|
| 7,857,631 B2 | 12/2010 | Cavegn et al. | |
| 8,690,583 B2 | 4/2014 | Uesaka et al. | |
| 2011/0104959 A1* | 5/2011 | Asai et al. | ............. 439/823 |

FOREIGN PATENT DOCUMENTS

| | | |
|---|---|---|
| JP | 2010-092803 | 4/2010 |
| JP | 2012-514310 | 6/2012 |

* cited by examiner

*Primary Examiner* — Vincent Q Nguyen
*Assistant Examiner* — Trung Nguyen
(74) *Attorney, Agent, or Firm* — IPUSA, PLLC

(57) ABSTRACT

A connector includes a connector case and probe pins that are arranged two-dimensionally in the connector case. Each of the probe pins includes a housing, a first contact terminal disposed at one end of the housing, a second contact terminal disposed at another end of the housing, and plural bent parts formed in the housing and protruding outward from a surface of the housing. The connector case includes through holes. Each of the through holes accommodates the probe pin and includes grooves that are formed in its inner surface and correspond to the bent parts. The grooves of each through hole face substantially the same directions as the grooves of other through holes.

7 Claims, 10 Drawing Sheets

S: SIGNAL
G: GND

CONNECTOR

CROSS-REFERENCE TO RELATED APPLICATION

The present application is based upon and claims the benefit of priority of Japanese Patent Application No. 2013-216727, filed on Oct. 17, 2013, the entire contents of which are incorporated herein by reference.

BACKGROUND OF THE INVENTION

1. Field of the Invention

An aspect of this disclosure relates to a connector.

2. Description of the Related Art

There exists a connector for connecting terminals of a semiconductor device such as a central processing unit (CPU) to a test board of an inspection apparatus when the semiconductor device is tested. Such a connector includes multiple probe pins that are made of, for example, a metal and arranged two-dimensionally (see, for example, Japanese Laid-Open Patent Publication No. 2010-092803 and Japanese Laid-Open Patent Publication No. 2012-514310). Probe pins are also called pogo pins. A probe pin includes a spring, and can expand and contract lengthwise. One end of a probe pin in the longitudinal direction is brought into contact with a terminal of, for example, a CPU and another end of the probe pin in the longitudinal direction is brought into contact with a terminal of a test board to electrically connect the terminal of the CPU to the terminal of the test board.

When characteristics of two-dimensionally arranged probe pins of a connector are not uniform, the connector may not be able to fully support high-speed transmission.

Accordingly, a connector with two-dimensionally arranged probe pins that supports high-speed transmission is desired.

SUMMARY OF THE INVENTION

An aspect of this disclosure provides a connector including a connector case and probe pins that are arranged two-dimensionally in the connector case. Each of the probe pins includes a housing, a first contact terminal disposed at one end of the housing, a second contact terminal disposed at another end of the housing, and plural bent parts formed in the housing and protruding outward from a surface of the housing. The connector case includes through holes. Each of the through holes accommodates the probe pin and includes grooves that are formed in its inner surface and correspond to the bent parts. The grooves of each through hole face substantially the same directions as the grooves of other through holes.

DESCRIPTION OF EMBODIMENTS

Embodiments of the present invention are described below with reference to the accompanying drawings. The same reference number is assigned to the same component throughout the accompanying drawings, and repeated descriptions of the same component are omitted.

First Embodiment

A connector 100 according to a first embodiment is described below.

Figure 1:
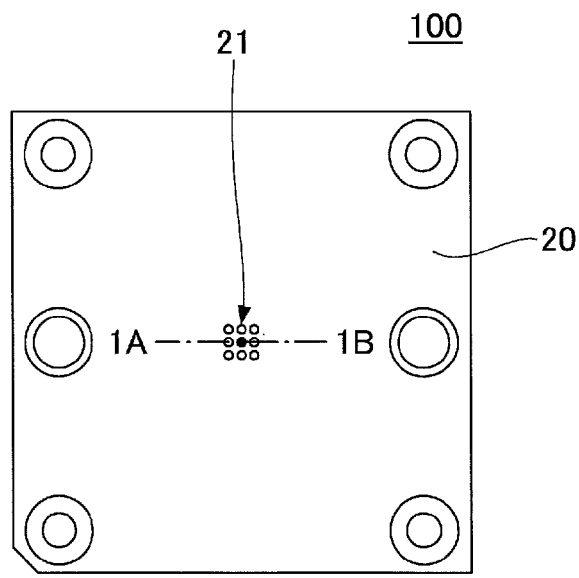
FIG. 1 is a top view of a connector.
Figure 2:
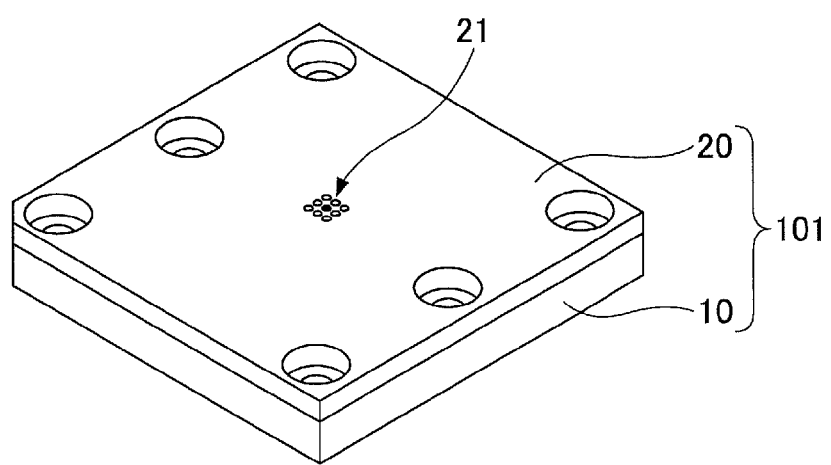
FIG. 2 is a perspective view of a connector.
Figure 3:
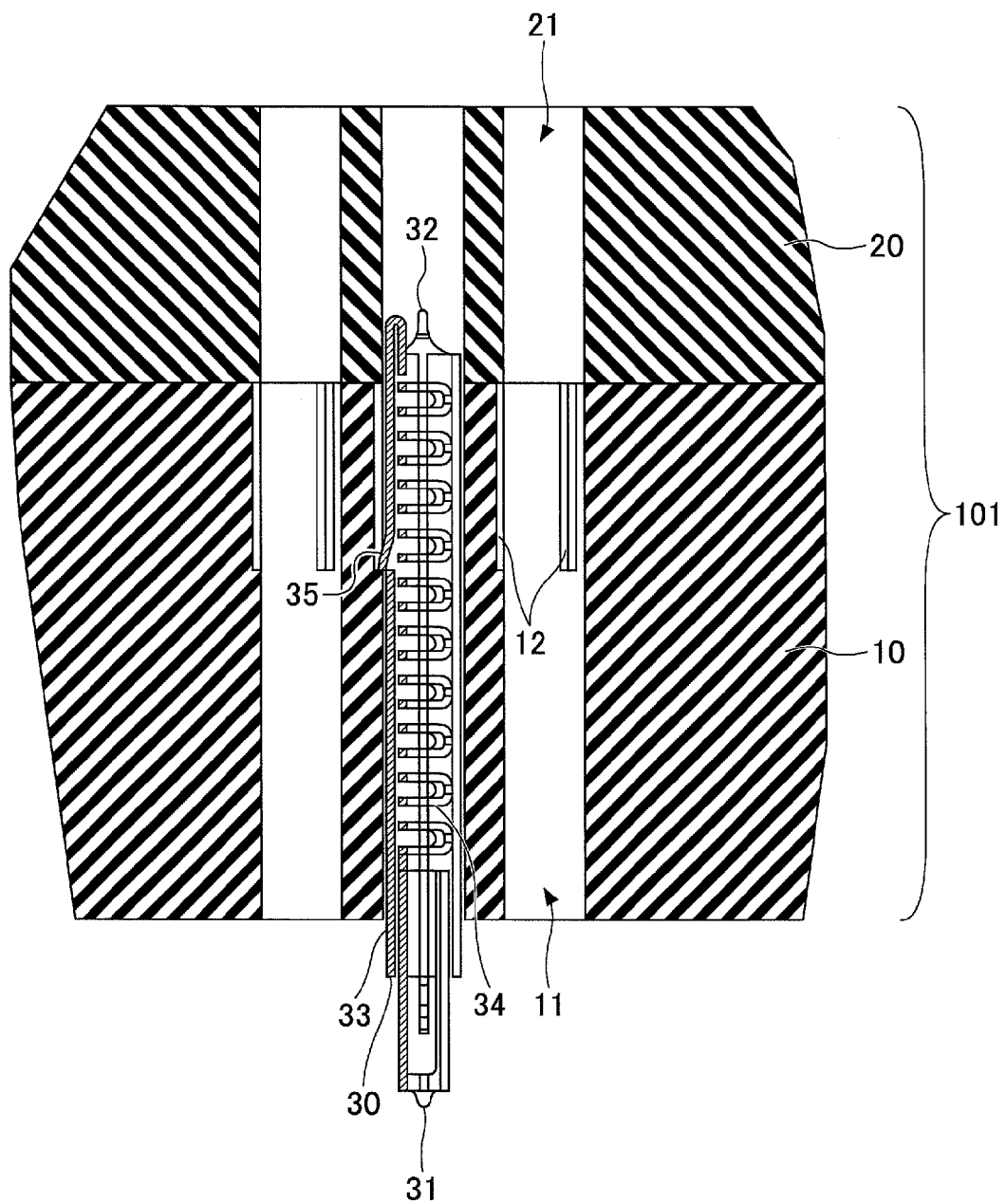
FIG. 3 is a cross-sectional view of a connector taken along dashed-dotted line 1A-1B of FIG. 1.

FIG. 1 is a top view and FIG. 2 is a perspective view of the connector 100. FIG. 3 is a cross-sectional view of the connector 100 taken along dashed-dotted line 1A-1B of FIG. 1. As illustrated by FIGS. 1 through 3, the connector 100 of the present embodiment includes a connector case 101 including a socket 10 and a cover 20, and multiple probe pins 30 (for brevity, only one probe pin 30 is illustrated in FIG. 3) that are arranged two-dimensionally in the connector case 101.

Figure 4:
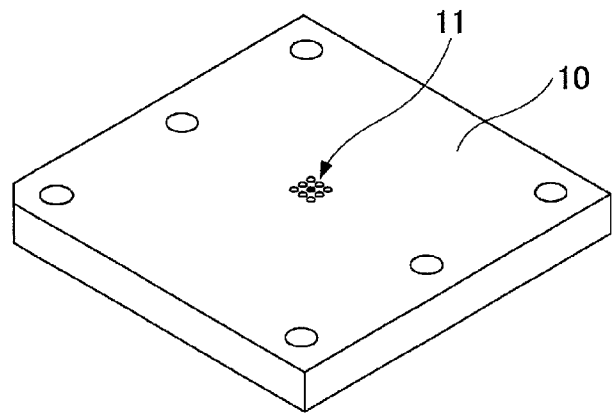
FIG. 4 is a perspective view of a socket.
Figure 5:
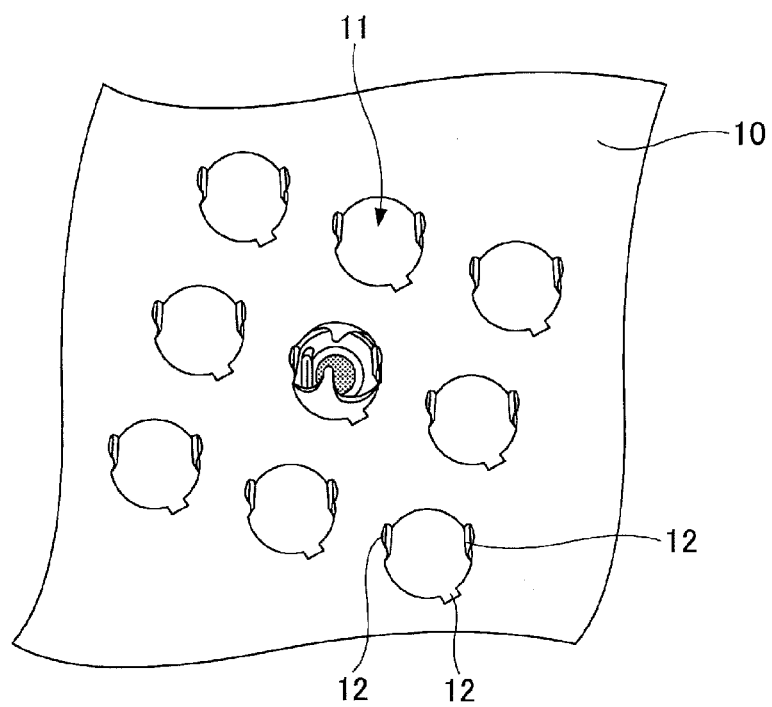
FIG. 5 is an enlarged view of a part of a socket.

FIG. 4 is a perspective view of the socket 10, and FIG. 5 is an enlarged view of a part of the socket 10 of FIG. 4 where the through holes 11 are formed. The socket 10 is made of, for example, a resin material having insulating properties. As illustrated by FIGS. 4 and 5, two-dimensionally arranged through holes 11 for accommodating the probe pins 30 are formed in the socket 10. Grooves 12 are formed in an inner surface of each through hole 11. The grooves 12 are used to fix the probe pin 30 and mate with bent parts 35 of the probe pin 30.

The cover 20 is made of, for example, a resin material having insulating properties. As illustrated by FIGS. 1 and 2, two-dimensionally arranged through holes 21 for accommodating the probe pins 30 are formed in the cover 20.

Figure 6:
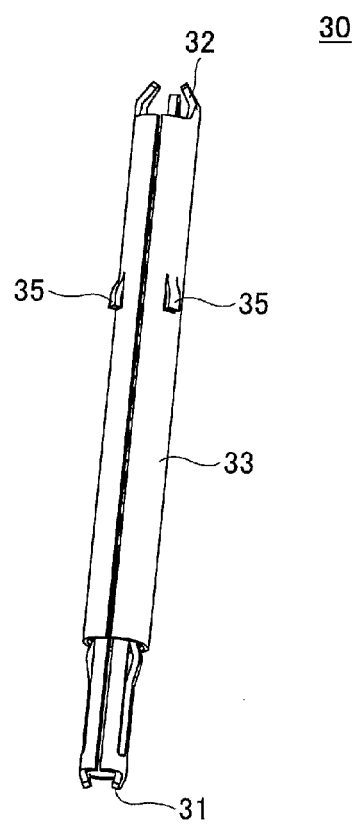
FIG. 6 is a perspective view of a probe pin.
Figure 7:
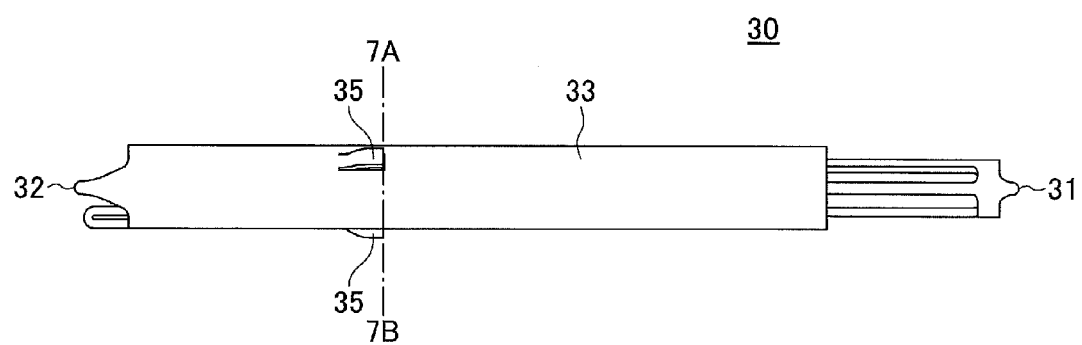
FIG. 7 is a side view of a probe pin.
Figure 8:
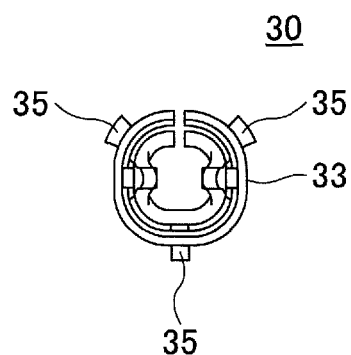
FIG. 8 is a cross-sectional view of a probe pin taken along dashed-dotted line 7A-7B of FIG. 7.

FIG. 6 is a perspective view and FIG. 7 is a side view of the probe pin 30. FIG. 8 is a cross-sectional view of the probe pin 30 taken along dashed-dotted line 7A-7B of FIG. 7.

The probe pin 30 is made of a conductive metal material such as copper (Cu) or beryllium copper. As illustrated by FIGS. 6 and 7, the probe pin 30 includes a housing 33 forming an outer surface of the probe pin 30, a contact terminal 31 disposed at one end of the housing 33 in the longitudinal direction, and a contact terminal 32 disposed at another end of the housing 33 in the longitudinal direction. As illustrated by FIG. 3, a spring 34 is provided in the housing 33. The spring 34 expands and contracts according to a force applied by the contact terminal 31 and the contact terminal 32. This configuration ensures the contact between the contact terminal 31 and a terminal of a test board and the contact between the contact terminal 32 and a terminal of, for example, a CPU.

Three bent parts 35 are formed in the housing 33. The bent parts 35 are formed by cutting parts of the housing 33 and bending the cut parts outward such that the cut parts protrude from the surface of the housing 33. The probe pin 30 is placed in the through hole 11 of the socket 10 with the bent parts 35 of the housing 33 fitted into the grooves 12 formed in the inner surface of the through hole 11. With the probe pins 30 placed in the through holes 11, the cover 20 is placed on the socket 10 such that the through holes 11 of the socket 10 and the through holes 21 of the cover 20 are aligned with each other. The bent parts 35 are formed such that they are arranged at regular intervals along the circumference of the housing 33.

In the present embodiment, the length of the probe pin 30 in the longitudinal direction is about 5 mm, the length (or width) of the cross section of the housing 33 is about 0.5 mm, and the bent part 35 protrudes from the surface of the housing 33 by about 0.05 mm.

Figure 9:
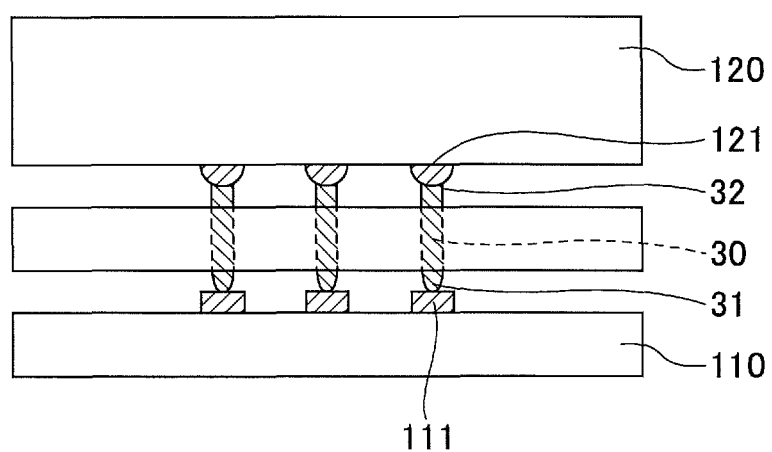
FIG. 9 is a drawing illustrating a connector connecting a test board and a semiconductor device.

In FIG. 9, the connector 100 is used to connect a test board 110 of, for example, a tester and a semiconductor device 120 such as a CPU for testing. The contact terminals 31 of the probe pins 30 of the connector 100 are brought into contact with electrode terminals 111 of the test board 110, and the contact terminals 32 of the probe pins 30 are brought into contact with electrode terminals 121 of the semiconductor device 120 to test the semiconductor device 120. A test of the semiconductor device 120 is performed with the test board 110 and the semiconductor device 120 connected via the connector 100.

Figure 10:
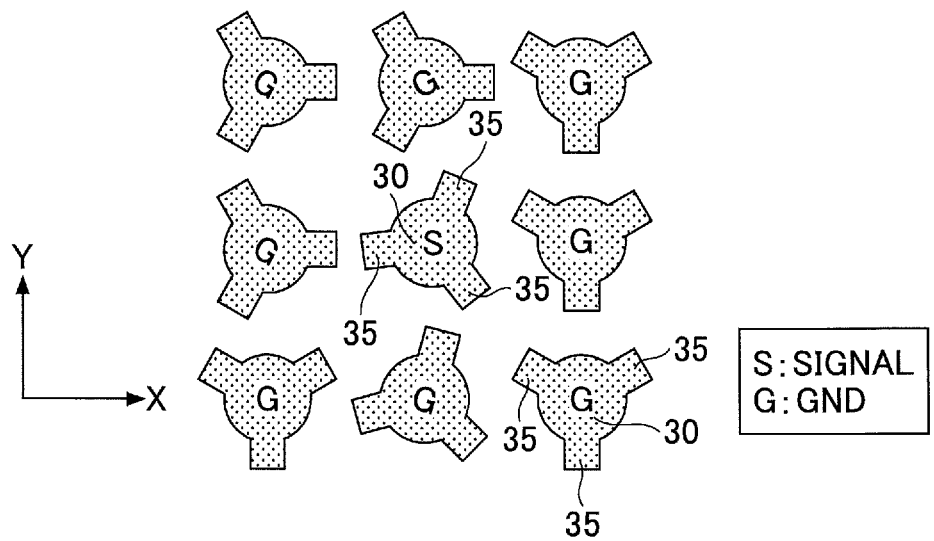
FIG. 10 is a drawing illustrating an exemplary arrangement of probe pins.

According to the present embodiment, three bent parts 35 are formed in the housing 33 of the probe pin 30. When the probe pins 30 are placed in the socket 10 and the cover 20 such that the bent parts 35 of the probe pins 30 are randomly oriented as illustrated by FIG. 10, interference occurs between the probe pins 30, and the impedance and transmission characteristics of the probe pins 30 vary. When the bent parts 35 of the probe pins 30 face various directions (i.e., when the grooves 12 of the through holes 11 face random directions), the distance between the bent parts 35 of different probe pins 30 varies, and the influence of interference between bent parts 35 of adjacent probe pins 30 located close to each other becomes different from the influence of interference between bent parts 35 of adjacent probe pins 30 located far from each other. This results in a difference in impedance and transmission characteristics between the probe pins 30. Interference tends to easily occur between bent parts 35 of the probe pins 30 that are close to each other.

Figure 11:
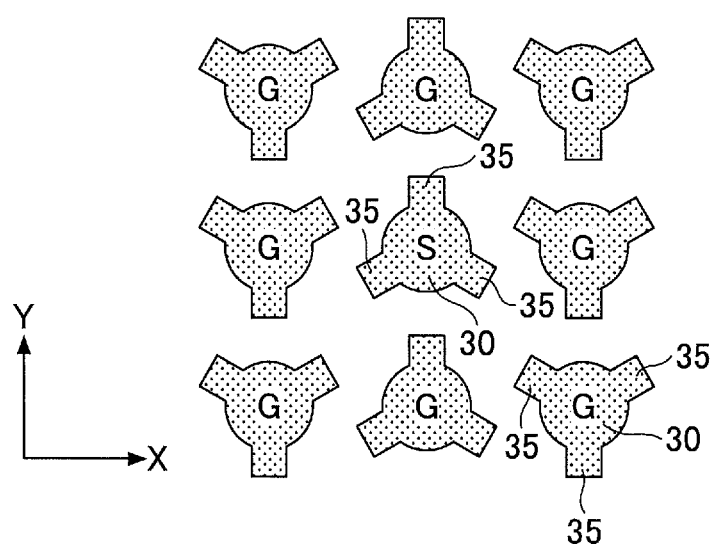
FIG. 11 is a drawing illustrating an exemplary arrangement of probe pins according to a first embodiment.

In the present embodiment, the probe pins 30 whose housing 33 includes three bent parts 35 are arranged, for example, as illustrated by FIG. 11. In FIG. 11, the corresponding bent parts 35 of the probe pins 30 arranged in a Y direction face the same direction. This arrangement prevents variation in impedance and transmission characteristics between the probe pins 30. More specifically, the probe pins 30 arranged in the Y direction (first direction) are oriented such that the corresponding bent parts 35 of the probe pins 30 face the same direction. On the other hand, the probe pins 30 arranged in an X direction (second direction) are oriented such that the corresponding bent parts 35 of the adjacent probe pins 30 face opposite directions. In other words, the corresponding grooves 12 of the through holes 11 arranged in the Y direction face the same direction, and the corresponding grooves 12 of the through holes 11 arranged in the X direction face opposite directions. This arrangement prevents the bent parts 35 of the adjacent probe pins 30 from being positioned close to each other, and prevents variation in impedance and transmission characteristics between the probe pins 30. In the examples of FIGS. 10 and 11, a center probe pin 30 labeled "S" transmits a signal, and other probe pins 30 labeled "G" and surrounding the center probe pin 30 (probe pins 30 closest to the center probe pin 30 and probe pins 30 second closest to the center probe pin 30) are grounded. In this embodiment, the Y direction (first direction) and the X direction (second direction) are orthogonal to each other.

Figure 12:
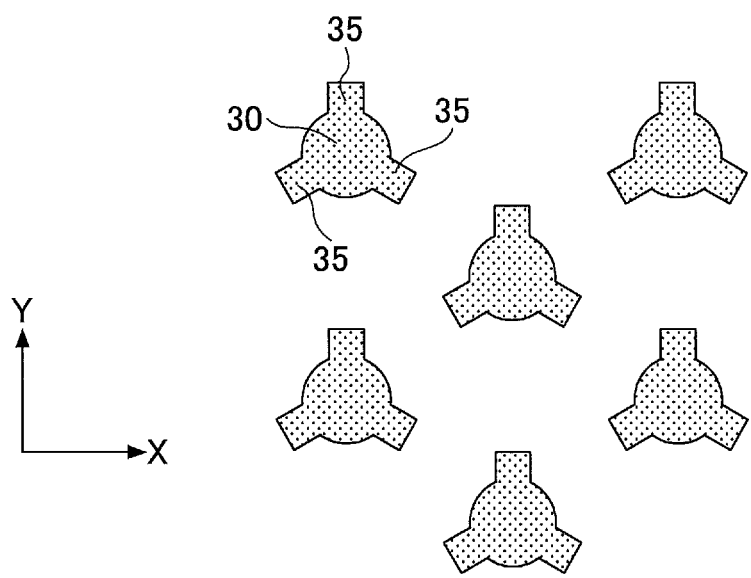
FIG. 12 is a drawing illustrating an exemplary arrangement of probe pins according to the first embodiment.

FIG. 12 illustrates an example where the probe pins 30 (or the through holes 11) are staggered. In this case, the probe pins 30 may be oriented such that the bent parts 35 of all the probe pins 30 face the same direction (i.e., the corresponding grooves 12 of all the through holes 11 face the same direction).

Second Embodiment

Figure 13:
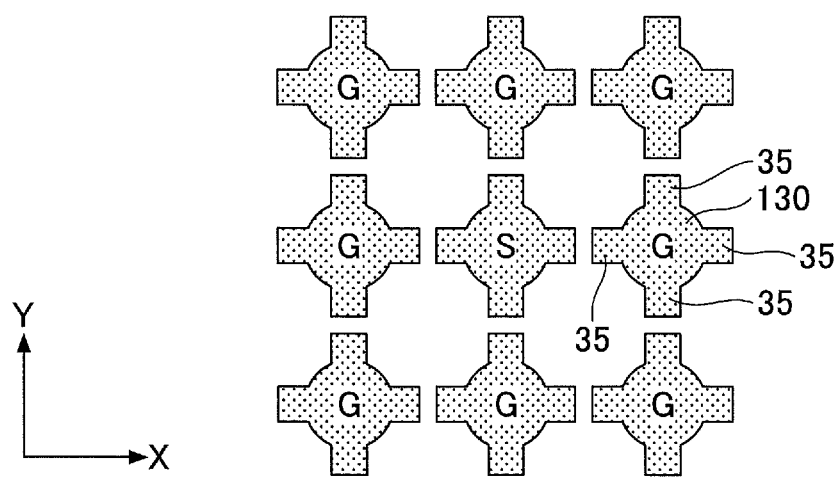
FIG. 13 is a drawing illustrating an exemplary arrangement of probe pins according to a second embodiment.
Figure 14:
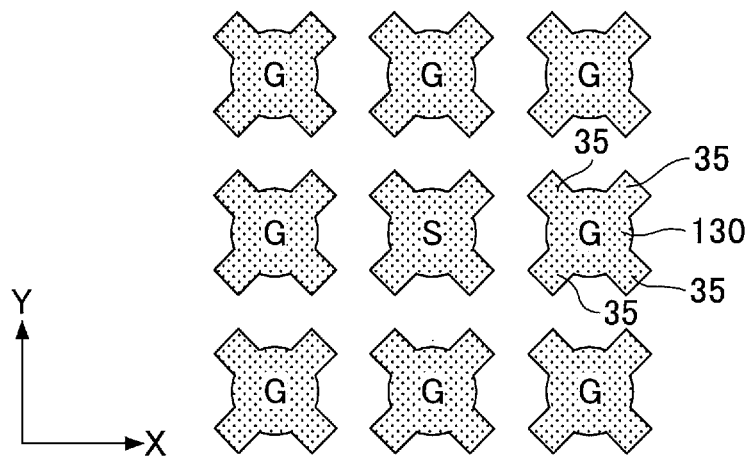
FIG. 14 is a drawing illustrating an exemplary arrangement of probe pins according to the second embodiment.

Next, a second embodiment is described. A connector of the second embodiment includes multiple probe pins 130 each including four bent parts 35. As illustrated by FIGS. 13 and 14, the probe pins 130 with four bent parts 35 may be arranged such that the bent parts 35 of all the probe pins 130 face the same direction.

As illustrated by FIG. 13, the probe pins 130 may be arranged such that the bent parts 35 face the X and Y directions in which the probe pins 130 are arranged. In other words, the probe pins 130 may be arranged such that the bent parts 35 of each probe pin 130 face the other probe pins 130 that are closest to the probe pin 130 (i.e., the grooves 12 of each through hole 11 face the other through holes 11 that are closest to the through hole 11). As illustrated by FIG. 14, the probe pins 130 may be arranged such that the bent parts 35 of each probe pin 130 face the other probe pins 130 that are second closest to the probe pin 130 (i.e., the grooves 12 of each through hole 11 face the other through holes 11 that are second closest to the through hole 11).

Figure 15:
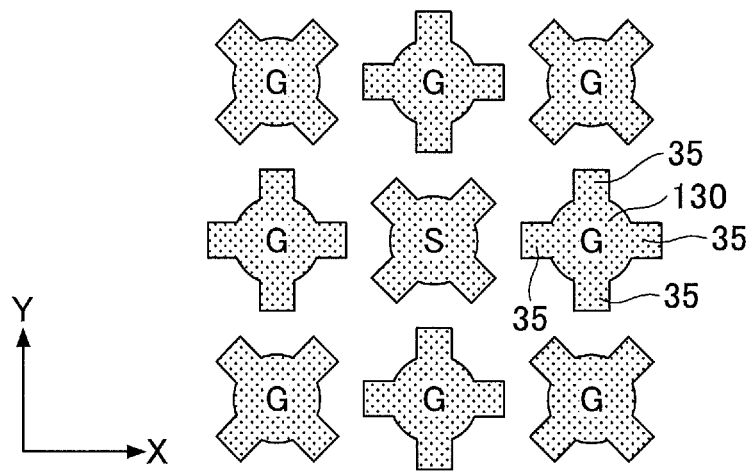
FIG. 15 is a drawing illustrating an exemplary arrangement of probe pins according to the second embodiment.

As illustrated by FIG. 15, the probe pins 130 may be arranged such that the bent parts 35 of each probe pin 130 face directions that are different by 45 degrees from the directions of the bent parts 35 of the other probe pins 130 closest to the probe pin 130, and that are the same as the directions of the bent parts 35 of the other probe pins 130 second closest to the probe pin 130. In other words, the grooves 12 of each through hole 11 may face directions that are different by 45 degrees from the directions of the grooves 12 of the other through holes 11 closest to the through hole 11, and that are the same as the directions of the grooves 12 of the other through holes 11 second closest to the through hole 11.

Figure 16:
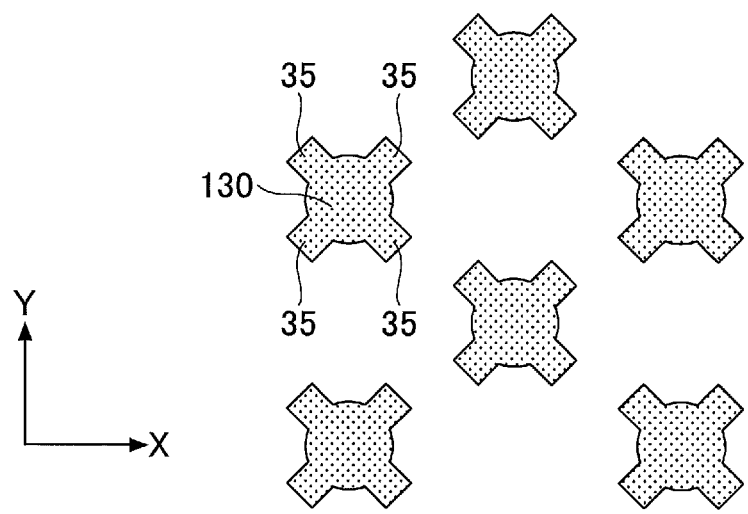
FIG. 16 is a drawing illustrating an exemplary arrangement of probe pins according to the second embodiment.
Figure 17:
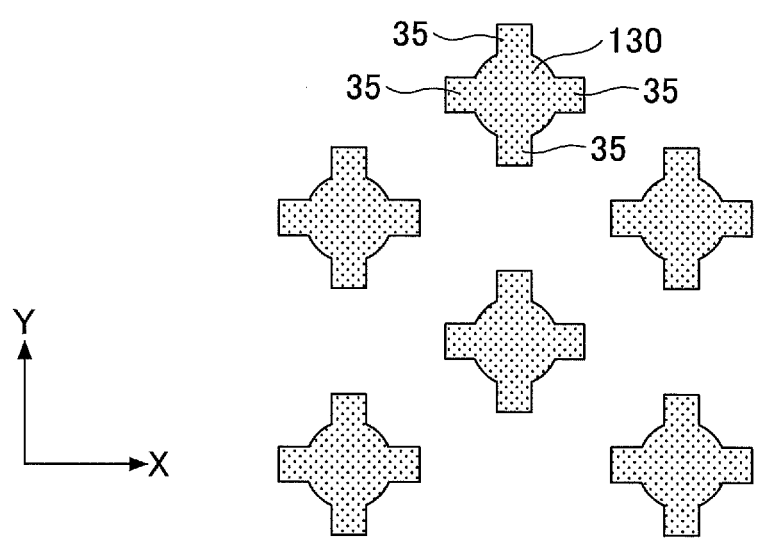
FIG. 17 is a drawing illustrating an exemplary arrangement of probe pins according to the second embodiment.

The probe pins 130 (or the through holes 11) may be staggered. As illustrated by FIGS. 16 and 17, the probe pins 130 (or the through holes 11) may be arranged such that the bent parts 35 (or the grooves 12) of all the probe pins 130 (or the through holes 11) face the same direction. As illustrated by FIG. 16, the probe pins 130 (or the through holes 11) may be arranged such that the bent parts 35 (or the grooves 12) face diagonal directions that are the same as the directions in which the probe pins 130 (or the through holes 11) are arranged. In other words, the probe pins 130 may be arranged such that the bent parts 35 of one probe pin 130 face the other probe pins 130 that are closest to the probe pin 130. As illustrated by FIG. 17, the probe pins 130 (or the through holes 11) may be arranged such that the bent parts 35 (or the grooves 12) of one probe pin 130 (or one through hole 11) face the other probe pins 130 (or the other through holes 11) that are second closest to the probe pin 130 (or the through hole 11).

Third Embodiment

Figure 18:
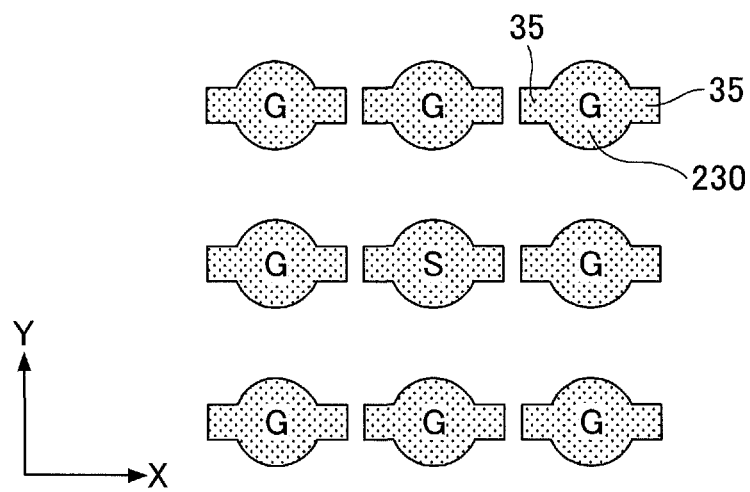
FIG. 18 is a drawing illustrating an exemplary arrangement of probe pins according to a third embodiment.
Figure 19:
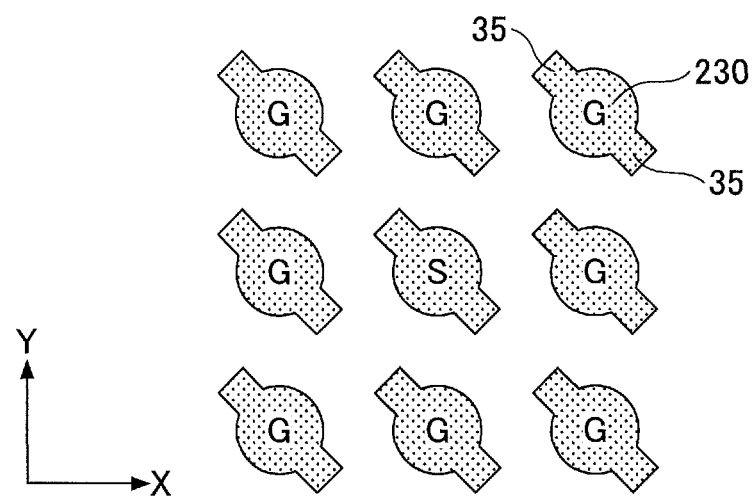
FIG. 19 is a drawing illustrating an exemplary arrangement of probe pins according to the third embodiment.

Next, a third embodiment is described. A connector of the third embodiment includes multiple probe pins 230 each including two bent parts 35. As illustrated by FIGS. 18 and 19, the probe pins 230 may be arranged such that the bent parts 35 (or the grooves 12) of all the probe pins 230 (or the through holes 11) face the same direction. As illustrated by FIG. 18, the probe pins 230 (or the through holes 11) may be arranged such that the bent parts 35 (or the grooves 12) face a direction that is the same as one of the directions in which the probe pins 230 (or the through holes 11) are arranged. In other words, the probe pins 230 may be arranged such that the bent parts 35 of one probe pin 230 face the other probe pins 230 that are closest to the probe pin 230 in one of the directions in which the probe pins 230 are arranged. As illustrated by FIG. 19, the probe pins 230 (or the through holes 11) may be arranged such that the bent parts 35 (or the grooves 12) of one probe pin 230 (or one through hole 11) face the other probe pins 230 (or the other through holes 11) that are second closest to the probe pin 230 (or the through hole 11) in one of two directions. According to the third embodiment, the probe pin 230 includes two bent parts 35. In terms of reliability, the probe pins 30 of the first embodiment and the probe pins 130 of the second embodiment are preferable compared with the probe pins 230 of the third embodiment.

An aspect of this disclosure provides a connector with two-dimensionally arranged probe pins that supports high-speed transmission.

A connector according to the embodiments is described above. However, the present invention is not limited to the specifically disclosed embodiments, and variations and modifications may be made without departing from the scope of the present invention.

What is claimed is:

1. A connector, comprising:
   a connector case; and
   probe pins that are arranged two-dimensionally in the connector case, wherein
   each of the probe pins includes a housing, a first contact terminal disposed at one end of the housing, a second contact terminal disposed at another end of the housing, and plural bent parts formed in the housing and protruding outward from a surface of the housing, said plural bent parts being integrally formed with the housing as one unit;
   the connector case includes through holes formed therein, each of the through holes accommodating the probe pin and including grooves formed in an inner surface thereof, and each of the grooves corresponding to the bent part; and
   the grooves of each through hole face substantially same directions as the grooves of other through holes.

2. The connector as claimed in claim 1, wherein the grooves of each through hole face other through holes that are closest to the through hole.

3. The connector as claimed in claim 1, wherein the grooves of each through hole face other through holes that are second closest to the through hole.

4. A connector, comprising:
   a connector case; and
   probe pins that are arranged two-dimensionally in the connector case, wherein
   each of the probe pins includes a housing, a first contact terminal disposed at one end of the housing, a second contact terminal disposed at another end of the housing, and three bent parts formed in the housing and protruding outward from a surface of the housing, said three bent parts being integrally formed with the housing as one unit;
   the connector case includes through holes formed therein, each of the through holes accommodating the probe pin and including grooves formed in an inner surface thereof, and each of the grooves corresponding to the bent part; and
   the through holes are arranged in the connector case in a first direction and a second direction intersecting the first direction such that
     the grooves of the through holes arranged in the first direction face substantially a same direction, and
     the grooves of adjacent through holes arranged in the second direction face substantially opposite directions.

5. A connector, comprising:
   a connector case; and
   probe pins that are arranged two-dimensionally in the connector case, wherein
   each of the probe pins includes a housing, a first contact terminal disposed at one end of the housing, a second contact terminal disposed at another end of the housing, and four bent parts formed in the housing and protruding outward from a surface of the housing, said four bent parts being integrally formed with the housing as one unit;
   the connector case includes through holes formed therein, each of the through holes accommodating the probe pin and including grooves formed in an inner surface thereof, and each of the grooves corresponding to the bent part; and
   the through holes are arranged in the connector case such that the grooves of a first through hole face directions that are different from directions of the grooves of a second through hole closest to the first through hole.

6. The connector as claimed in claim 5, wherein the grooves of the first through hole face the directions that are substantially same as directions of the grooves of a third through hole second closest to the first through hole.

7. The connector as claimed in claim 1, wherein a first probe pin of the probe pins transmits a signal, and second probe pins of the probe pins closest to the first probe pin are grounded.

* * * * *